(12) United States Patent
Ko

(10) Patent No.: US 7,541,641 B2
(45) Date of Patent: Jun. 2, 2009

(54) GATE STRUCTURE IN A TRENCH REGION OF A SEMICONDUCTOR DEVICE AND METHOD FOR MANUFACTURING THE SAME

(75) Inventor: Kwang Young Ko, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 4 days.

(21) Appl. No.: 11/646,837

(22) Filed: Dec. 27, 2006

(65) Prior Publication Data

US 2007/0152245 A1 Jul. 5, 2007

(30) Foreign Application Priority Data

Dec. 29, 2005 (KR) ............. 10-2005-0134468

(51) Int. Cl.
- *H01L 29/76* (2006.01)
- *H01L 29/94* (2006.01)
- *H01L 31/062* (2006.01)
- *H01L 31/113* (2006.01)
- *H01L 31/119* (2006.01)

(52) U.S. Cl. ............ 257/330; 257/328; 257/329; 257/331; 257/332; 257/333; 257/334

(58) Field of Classification Search ......... 257/328–334
See application file for complete search history.

(56) References Cited

U.S. PATENT DOCUMENTS

| | | | | |
|---|---|---|---|---|
| 5,689,128 | A * | 11/1997 | Hshieh et al. | 257/331 |
| 6,319,776 | B1 | 11/2001 | Tung | |
| 6,391,698 | B1 | 5/2002 | Tung | |
| 6,767,783 | B2 * | 7/2004 | Casady et al. | 438/234 |
| 7,109,551 | B2 * | 9/2006 | Sugi et al. | 257/330 |
| 2005/0167695 | A1 * | 8/2005 | Yilmaz | 257/134 |
| 2005/0189585 | A1 * | 9/2005 | Jones | 257/330 |
| 2005/0224871 | A1 * | 10/2005 | Ma | 257/330 |
| 2005/0224891 | A1 * | 10/2005 | Xu | 257/382 |
| 2006/0017056 | A1 * | 1/2006 | Hirler | 257/77 |

OTHER PUBLICATIONS

First Office Action; Application No. 200610170172.9; Dated: May 9, 2008; The State Intellectual Property Office of the People's Republic of China; People's Republic of China.

* cited by examiner

*Primary Examiner*—Ida M Soward
(74) *Attorney, Agent, or Firm*—Andrew D. Fortney

(57) ABSTRACT

Disclosed are a gate structure in a trench region of a semiconductor device and method for manufacturing the same. The semiconductor device includes a pair of drift regions formed in a semiconductor substrate; a trench region formed between the pair of drift regions; an oxide layer spacer on sidewalls of the trench region; a gate formed in the trench region; and a source and a drain formed in the pair of the drift regions, respectively.

15 Claims, 4 Drawing Sheets

GATE STRUCTURE IN A TRENCH REGION OF A SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the same.

2. Description of the Related Art

High voltage devices require a low-density drift region in a drain so as to have breakdown characteristics against high voltages. The drift region occupies the largest area in the high voltage device. Larger drift region is required in a horizontal direction as the higher breakdown characteristic is required for the high voltage device.

Further, in order to realize a high voltage breakdown characteristic, it is necessary for the high voltage device to increase the length of a channel region for preventing the punch through between a source and a drain. The channel region occupies the second largest area in the high voltage device.

Hereinafter, a high voltage device according to the related art will be described in detail with reference to the attached drawings.

FIG. 1 is a cross-sectional view of a high voltage device according to the related art.

Referring to FIG. 1, a low-density drift region 11 is formed on a predetermined region of a p-type semiconductor substrate 10. A gate oxide layer 12 is formed on an upper surface of the p-type semiconductor substrate 10, and a field oxide layer 13 for a field plate is formed on the semiconductor substrate 10 corresponding to a part of the drift region 11.

A gate 14 is formed on the gate oxide layer 12 and the field plate 13. A source 15 and a drain 16, i.e., n-type doped region 15 having a high-density are formed adjacent to both sides of the gate 14 and in the semiconductor substrate 10. At this time, the source 15 is spaced apart from the drift region 11, and the drain 16 is formed in the drift region 11.

The channel region 17 is formed between the source 15 and the drift region 11 in the semiconductor substrate 10 below the gate 14, and electrons 18 flow from the source region 15 to the drain region 16.

In the conventional high voltage device as described above, the drift region 11 needs to be increased in its horizontal length due to its horizontal structure so as to improve the breakdown characteristic. This may act as limitations in high-integration and miniaturization of the semiconductor device.

SUMMARY OF THE INVENTION

Accordingly, the present invention has been made to solve the above-mentioned problems, and an object of the present invention is to provide a semiconductor device and a method for manufacturing the same, which can reduce an area of a device while sustaining the breakdown strength.

To accomplish the above object of the present invention, there is provided a semiconductor device, which comprises a pair of drift regions formed in a semiconductor substrate; a trench region formed between the pair of drift regions; an oxide layer spacer formed on both sidewalls of the trench region; an insulating layer formed below the trench region; a gate formed in the trench region; and a source and a drain formed in the pair of the drift regions, respectively.

To accomplish the above object of the present invention, there is provided a method for manufacturing a semiconductor device, which comprises the steps of: forming a pair of drift regions in a semiconductor substrate; forming an oxide layer on the substrate in such a manner that the oxide layer is partially overlapped with the pair of drift regions; forming a trench region between the pair of drift regions; forming an oxide layer spacer on both sidewalls of the trench region; forming an insulating layer below the trench region; forming a gate in the trench region and on the oxide layer; and forming a source and a drain on the pair of drift regions, respectively.

DETAILED DESCRIPTION OF THE INVENTION

Figure 1:
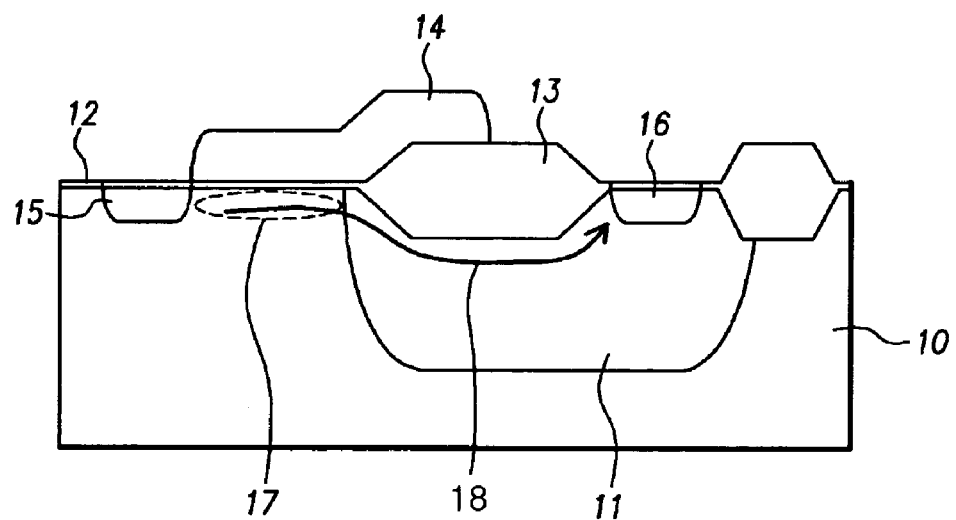
FIG. 1 is a cross-sectional view of a high voltage device according to the related art.

Hereinafter, a preferred embodiment according to the present invention will be described in detail, with reference to the following drawings.

In the following description of the present invention, technologies which are generally known in the art and do not directly relate to the present invention will be omitted in order to avoid redundancy and to clarify the subject manner of the present invention. In the same manner, some of elements are exaggerated, omitted or simplified in the drawings and the elements may have sizes different from those shown in drawings, in practice.

FIG. 2A to 2G are cross-sectional views showing a semiconductor device and a method for manufacturing the same according to a preferred embodiment of the present invention.

Figure 2A:
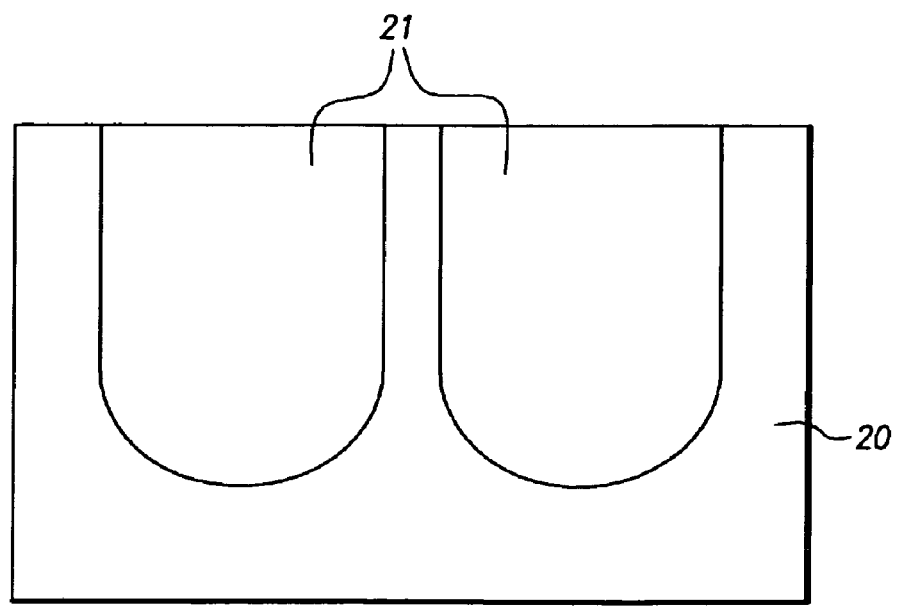
FIGS. 2A to 2G are cross-sectional views showing a semiconductor device and a method for manufacturing the same according to a preferred embodiment of the present invention.

First, as shown in FIG. 2A, a pair of drift regions 21, which are symmetrical to each other, are formed in a p-type semiconductor substrate 20.

The drift regions 21 are deeply formed in the vertical direction, and spaced apart from each other in the horizontal direction by a predetermined distance.

A method for forming the drift region 21 includes the steps of; forming a drift region mask pattern in the semiconductor substrate 20; implanting n-type low-density impurities; and driving-in the implanted impurities.

Figure 2B:
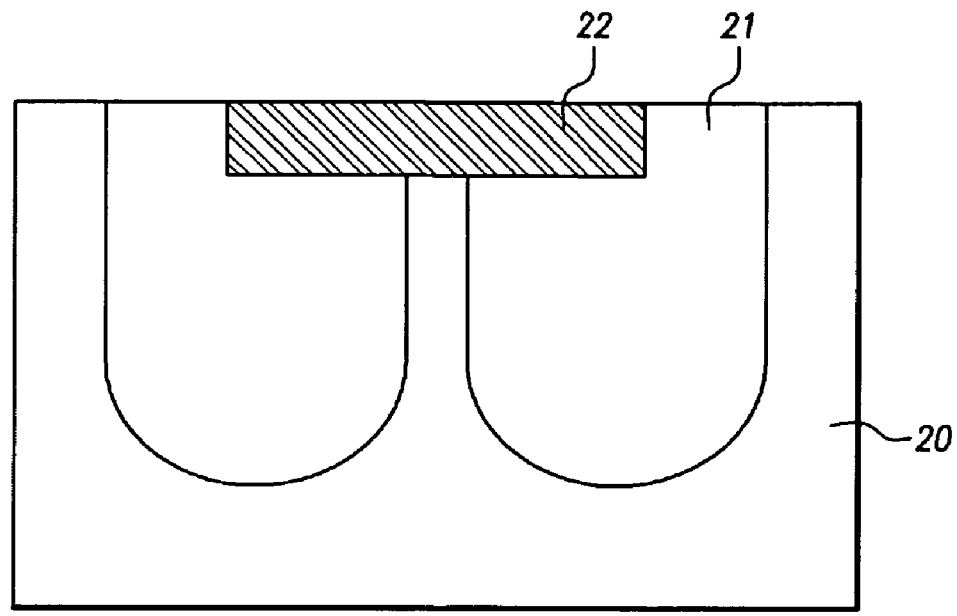
Figure 2C:
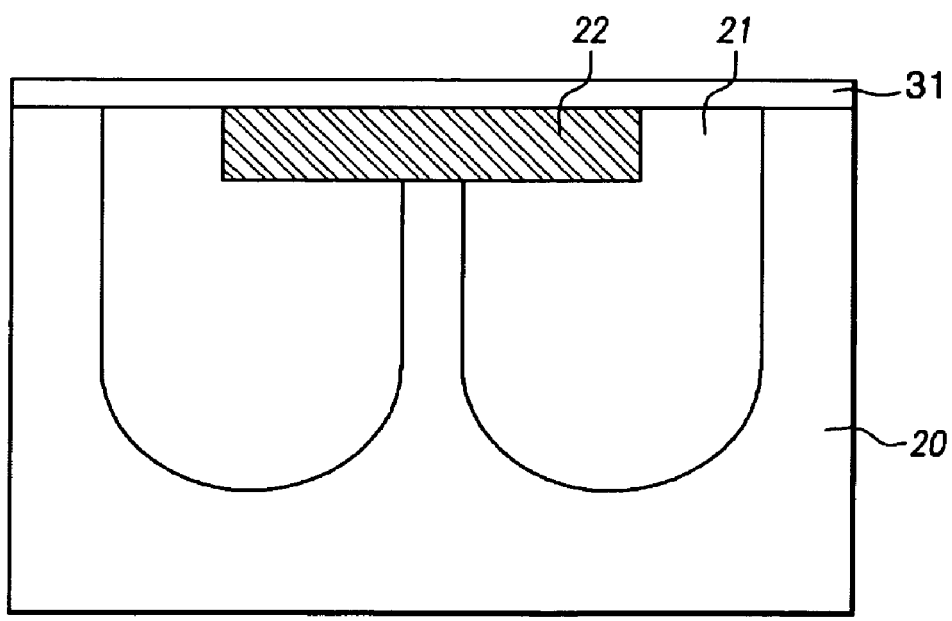
Figure 2D:
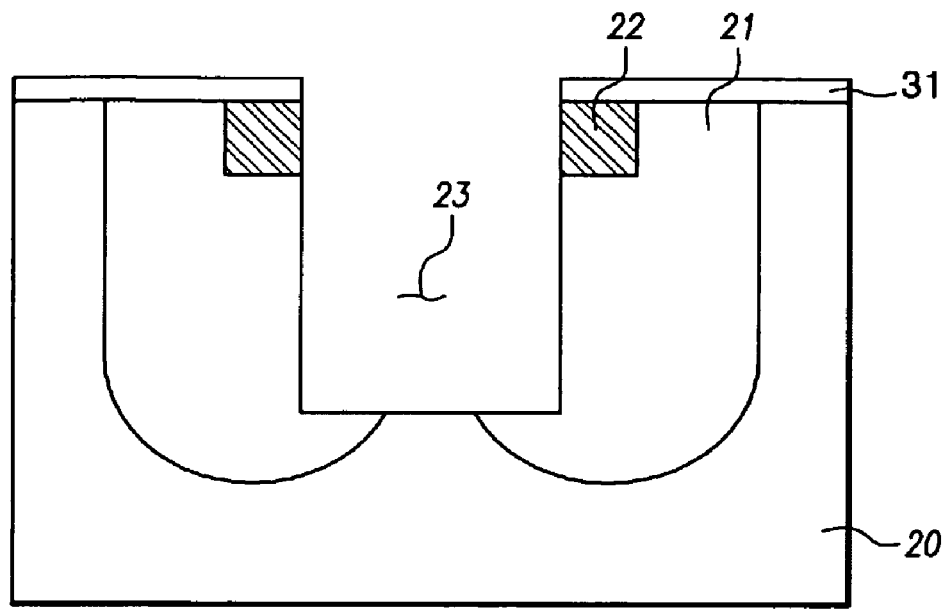

Next, as shown in FIG. 2B, an oxide layer 22 is formed on the surface of the substrate 20 such that the oxide layer 22 is partially overlapped with both drift regions 21. In other words, the length of the oxide layer 22 is larger than the distance between both drift regions 21.

A method for forming the oxide layer 22 includes the steps of; forming an oxide layer mask pattern on the substrate 20; etching the substrate 20 by a predetermined depth; depositing the oxide layer 22 over the entire surface; and planarizing the oxide layer 22.

As shown in 2C, a nitride layer 31 is formed on the substrate 20.

Next, as shown in 2D, a trench region 23 is formed between both drift regions and in the substrate 20.

The trench region 23 has a depth than equal to or shallower than that of the drift region 21, and a width shorter than the length of the oxide layer 22.

A method for forming the trench region 23 includes the steps of; forming a trench region mask pattern; and etching the substrate 20 by a predetermined depth.

Figure 2E:
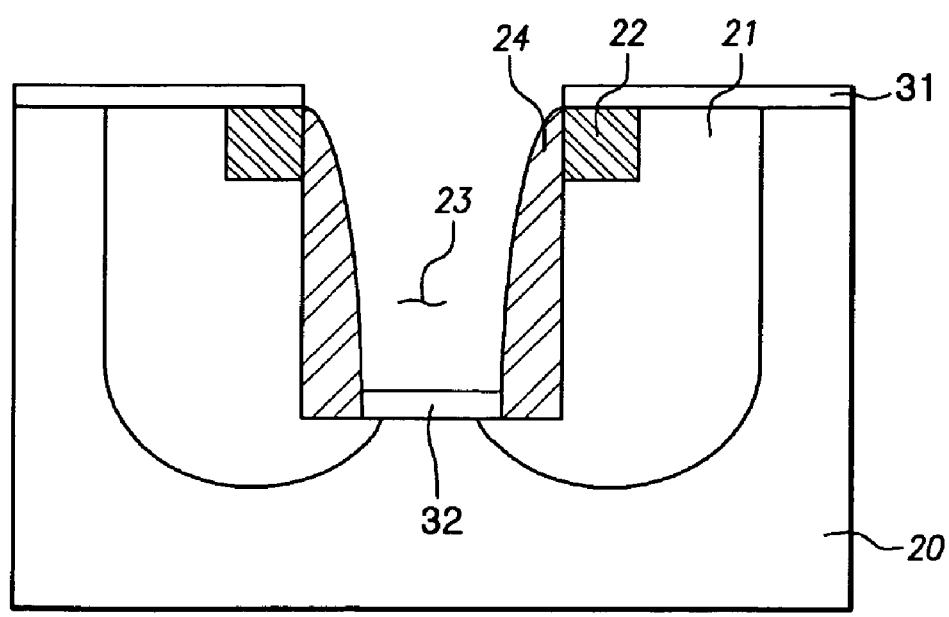

Next, as shown in FIG. 2E, an oxide layer spacer 24 is formed on both sidewalls of the trench region 23. The oxide layer spacer 24 is used as a field plate of a high voltage device.

A method for forming the oxide layer spacer 24 includes the steps of; depositing the oxide layer over the entire surface; and anisotropic dry etching the deposited oxide layer.

An insulating layer 32 is formed below the trench region 23. The insulating layer 32 is a thermal oxide layer formed by performing a thermal oxidation process.

Next, the nitride layer 31 is removed.

Figure 2F:
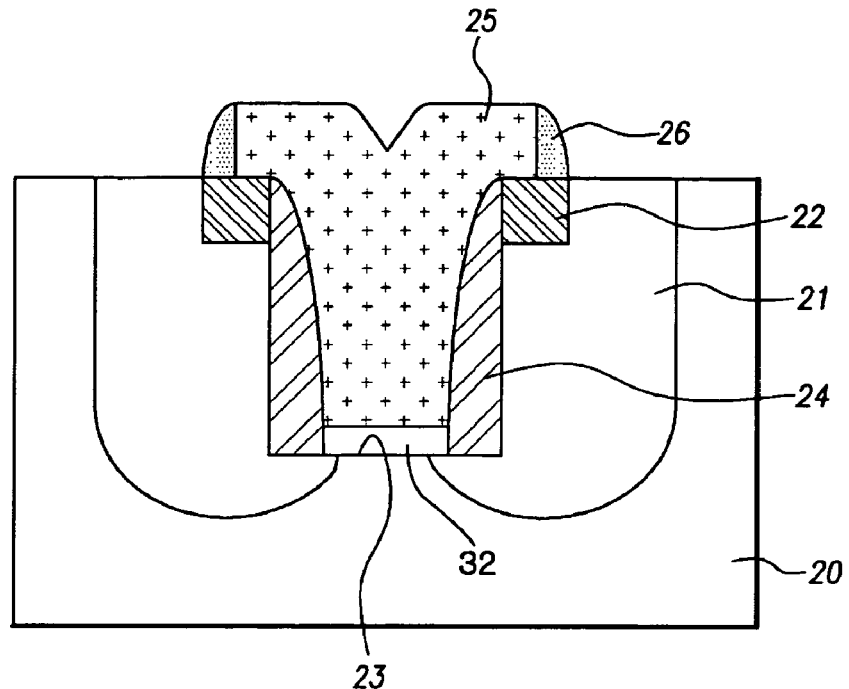

Next, as shown in FIG. 2F, a gate 25 is formed in the trench region 23 and on the upper surface of the oxide layer 22. After that, a nitride layer spacer 26 is formed on both sidewalls of the gate 25.

A method for forming the gate 25 includes the steps of; depositing a gate conductive layer so as to be completely filled in the trench region 23; forming a gate mask pattern; and etching the gate conductive layer. Further, a method for forming the nitride layer spacer 26 includes the steps of; depositing the nitride layer over the entire surface; and anisotropic dry etching the deposited nitride layer.

Figure 2G:
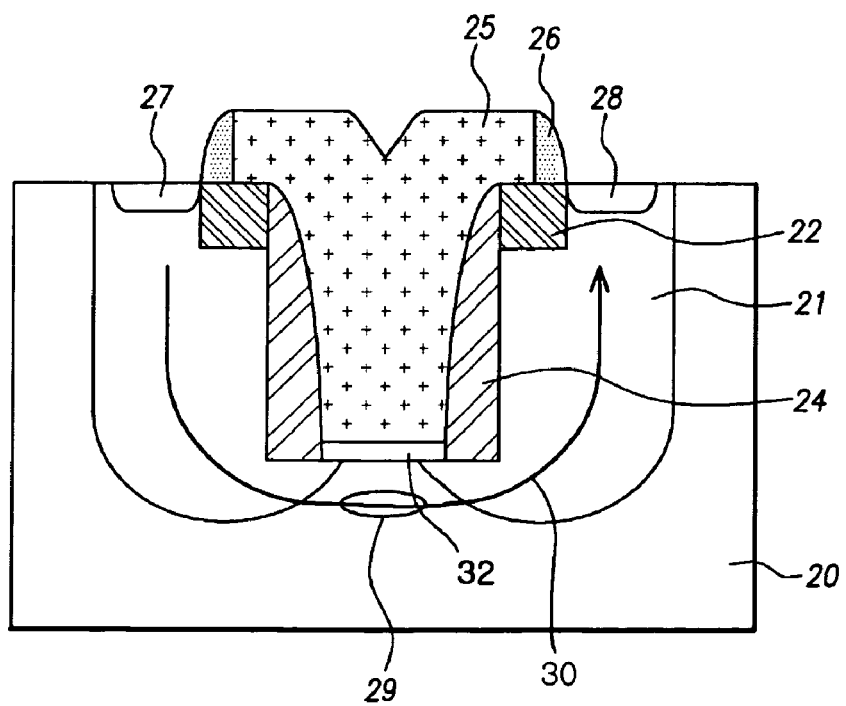

Next, as shown in FIG. 2G, a source 27 and a drain 28 are formed on both drift regions 21, respectively, by implanting n-type impurities having a high density.

Further, electrons 30 flow between the source 27 and the drain 28.

As described above, the semiconductor device is featured in that the drift regions 21 having a vertical structure are formed to be symmetrical to each other in the left and right direction.

In the high voltage device according to the present invention, since a depletion region is formed in a vertical direction when a high electric power is applied to the drain 28, both lengths of the drift region 21 and the channel region 29 can be shorter about a several μm than that of the conventional structure, thereby reducing the area of the high voltage device.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A semiconductor device comprising:
   first and second drift regions in a semiconductor substrate;
   a trench region between the first and second drift regions;
   an oxide layer spacer on sidewalls of the trench region;
   an insulating layer below the trench region;
   a gate in the trench region;
   a sidewall spacer on sidewalls of the gate, wherein the sidewall spacer comprises silicon nitride; and
   a source in one of the first and second drift regions and a drain in the other of the first and second drift regions.

2. The semiconductor device according to claim 1, wherein the trench region has a depth that is equal to or less than that of the first and second drift regions.

3. The semiconductor device according to claim 1, wherein the first and second drift regions are spaced apart from each other in a horizontal direction.

4. The semiconductor device according to claim 3, wherein the first and second drift regions are symmetrical to each other.

5. The semiconductor device according to claim 1, wherein the first and second drift regions each have a depth that is greater than a width thereof.

6. The semiconductor device according to claim 1, further comprising an oxide layer adjacent to the trench region.

7. The semiconductor device according to claim 6, wherein a part of the gate is on an upper surface of the oxide layer.

8. The semiconductor device according to claim 1, wherein the width of the trench is less than the length of the oxide layer.

9. A semiconductor device comprising:
   first and second drift regions in a semiconductor substrate;
   a trench region between the first and second drift regions;
   an oxide layer spacer on sidewalls of the trench region;
   an insulating layer below the trench region;
   an oxide layer adjacent to the trench region;
   a gate in the trench region and in part on an upper surface of the oxide layer; and
   a source in one of the first and second drift regions and a drain in the other of the first and second drift regions.

10. The semiconductor device according to claim 9, wherein the trench region has a depth that is equal to or less than that of the first and second drift regions.

11. The semiconductor device according to claim 9, wherein the first and second drift regions are spaced apart from each other in a horizontal direction.

12. The semiconductor device according to claim 11, wherein the first and second drift regions are symmetrical to each other.

13. The semiconductor device according to claim 9, wherein the first and second drift regions each have a depth that is greater than a width thereof.

14. The semiconductor device according to claim 9, further comprising a sidewall spacer on sidewalls of the gate above the oxide layer.

15. The semiconductor device according to claim 14, wherein the sidewall spacer comprises silicon nitride.

* * * * *